(12) United States Patent
Zwenger et al.

(10) Patent No.: US 6,897,550 B1
(45) Date of Patent: May 24, 2005

(54) FULLY-MOLDED LEADFRAME STAND-OFF FEATURE

(75) Inventors: Curtis M. Zwenger, Chandler, AZ (US); Raul M. Guerrero, Chandler, AZ (US); Dae Byoung Kang, Kyunggi-do (KR); Chul Woo Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 91 days.

(21) Appl. No.: 10/459,097

(22) Filed: Jun. 11, 2003

(51) Int. Cl.[7] .............................................. H01L 23/495
(52) U.S. Cl. ....................... 257/666; 257/730; 257/679
(58) Field of Search .................................. 257/666, 676, 257/679, 730, 787

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Narita |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,646,710 A | 3/1987 | Schmid et al. |
| 4,707,724 A | 11/1987 | Suzuki et al. |
| 4,737,839 A | 4/1988 | Burt |
| 4,756,080 A | 7/1988 | Thorp, Jr. et al. |
| 4,812,896 A | 3/1989 | Rothgery et al. |

(Continued)

FOREIGN PATENT DOCUMENTS

| | | |
|---|---|---|
| DE | 1973494 A1 | 8/1997 |
| EP | 54021117 | 6/1979 |
| EP | 59050939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 61395855 | 2/1986 |

(Continued)

Primary Examiner—Roy Potter
(74) Attorney, Agent, or Firm—Stetina Brunda Garred & Brucker (57) ABSTRACT

A memory card comprising a leadframe having at least one die pad, a plurality of contacts, and a plurality of conductive traces extending from respective ones of the contacts toward the die pad. The traces are bent in a manner wherein the die pad and the contacts extend along respective ones of spaced, generally parallel frame planes. Disposed on and extending from the die pad and the traces is a plurality of stand-offs. At least one semiconductor die is attached to the die pad and electrically connected to at least one of the traces. A body at least partially encapsulates the leadframe and the semiconductor die such that the contacts are exposed in a bottom surface defined by the body.

20 Claims, 3 Drawing Sheets

U.S. PATENT DOCUMENTS

| | | |
|---|---|---|
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,029,386 A | 7/1991 | Chao et al. |
| 5,041,902 A | 8/1991 | McShane |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasarathi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A * | 11/1999 | Takata et al. ............... 257/666 |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,018,189 A | 1/2000 | Mizuno |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |

| | | |
|---|---|---|
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |
| 6,113,474 A | 9/2000 | Shih et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,414,385 B1 | 7/2002 | Huang et al. |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,464,121 B2 | 10/2002 | Reijnders |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,120 B2 | 1/2003 | Lo et al. |
| 6,559,525 B2 | 5/2003 | Huang |
| 6,603,196 B2 | 8/2003 | Lee et al. |
| 6,624,005 B1 | 9/2003 | DiCaprio et al. |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0073265 A1 | 4/2003 | Hu et al. |

FOREIGN PATENT DOCUMENTS

| | | |
|---|---|---|
| JP | 629639 | 1/1987 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 4098864 | 3/1992 |
| JP | 5129473 | 5/1993 |
| JP | 5166992 | 7/1993 |
| JP | 5283460 | 10/1993 |
| JP | 692076 | 4/1994 |
| JP | 6260532 | 9/1994 |
| JP | 7297344 | 11/1995 |
| JP | 7312405 | 11/1995 |
| JP | 864634 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992776 | 4/1997 |
| JP | 9293822 | 11/1997 |
| JP | 10022447 | 1/1998 |
| JP | 10199934 | 7/1998 |
| JP | 10256240 | 9/1998 |
| JP | 00150765 | 5/2000 |
| KR | 941979 | 1/1994 |
| KR | 199772358 | 11/1997 |
| KR | 100220154 | 6/1999 |
| KR | 0049944 | 6/2002 |
| WO | 9956316 | 11/1999 |
| WO | 9967821 | 12/1999 |

\* cited by examiner

FULLY-MOLDED LEADFRAME STAND-OFF FEATURE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to circuit modules and, more particularly, to a memory card (e.g., a multi-media card (MMC)) comprising a leadframe which is implanted into a plastic body and provided with stand-off features which are arranged to prevent metal exposure subsequent to the molding of the body of the card.

As is well known in the electronics industry, circuit modules or cards are being used in increasing numbers to provide memory storage and other electronic functions for devices such as digital cameras, MP3 players, cellular phones, and personal digital assistants. In this regard, circuit modules are currently used in various memory card formats, including multi-media cards and secure digital cards.

Typically, circuit modules include multiple integrated circuit devices or semiconductor dies. The dies are interconnected using a circuit board substrate which adds to the weight, thickness, stiffness and complexity of the module. Circuit modules also include electrical contacts for providing an external interface to an insertion point or socket. These electrical contacts are typically disposed on the back side of the circuit board substrate, with the electrical connection to the dies being provided by vias which extend through the circuit board substrate.

In an effort to simplify the process steps needed to fabricate the circuit module and, hence, the memory card using the same, there has been developed by Applicant a circuit module wherein a leadframe assembly is used as an alternative to the circuit board substrate, as described in Applicant's co-pending U.S. application Ser. No. 09/956,190 entitled LEADFRAME METHOD AND ASSEMBLY FOR INTERCONNECTING CIRCUITS WITHIN A CIRCUIT MODULE filed Sep. 19, 2001, the disclosure of which is incorporated herein by reference. As is described in Ser. No. 09/956,190, the leadframe and semiconductor die of the circuit module may be covered with an encapsulant which hardens into a cover or body. The body is sized and configured to meet or achieve a "form factor" associated with the memory card. In the completed memory card, the contacts of the leadframe are exposed within a common surface of the body, with a die pad of the leadframe and the semiconductor die mounted thereto being disposed within or covered by the body.

Applicant has previously determined that the molding or encapsulation process used to form the body of the card sometimes gives rise to structural deficiencies or problems within the resultant memory card. These problems include portions of the die pad of the leadframe being exposed within the memory card, flash being disposed on the contacts of the leadframe, chipping in a peripheral flange area of the body, and mold gate pull-out wherein a portion of the mold or encapsulating compound is pulled out from within the body, leaving a small recess or void therein. To address these particular problems, Applicant has previously developed a memory card having a "die down" configuration attributable to the structural attributes of the leadframe included therein, and an associated molding methodology employed in the fabrication of such memory card. This die-down memory card is disclosed in Applicant's co-pending U.S. application Ser. No. 10/266,329 entitled DIE DOWN MULTI-MEDIA CARD ANI) METHOD OF MAKING SAME filed Oct. 8, 2002, the disclosure of which is also incorporated herein by reference. The present invention addresses and overcomes yet another problem which relates to the tendency of the metal of the leadframe to be pushed down or deflected during the molding operation used to form the body of the memory card. Particularly, in accordance with the present invention, the leadframe is provided with stand-off features which prevent the leadframe from being pushed down during the molding operation, thus substantially preventing undesirable occurrences of portions of the metal leadframe being exposed within the completely molded body of the memory card. These and other attributes of the present invention will be described in more detail below.

BRIEF SUMMARY OF THE INVENTION

In accordance with the present invention, there is provided a memory card including a leadframe which, in addition to including at least one die pad, a plurality of contacts and a plurality of conductive traces, includes multiple stand-offs which are disposed on and extend from the die pad and the traces. The stand-offs are uniquely configured to prevent the die pad and trace portions of the leadframe from being pushed down during a molding operation used to form the body of the memory card, thus substantially preventing undesirable occurrences of portions of the leadframe from being exposed within the completely molded body of the memory card.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
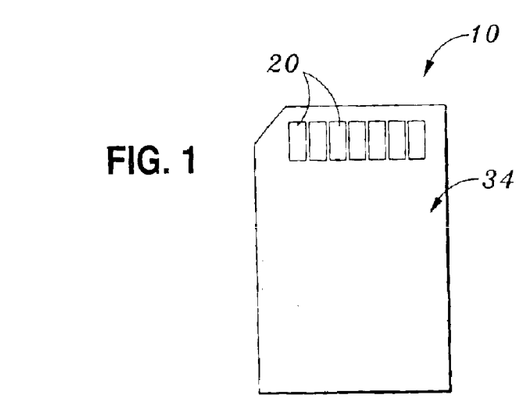
FIG. 1 is a bottom plan view of a memory card which is constructed in accordance with a first embodiment of the present invention and has a multi-media card form factor.
Figure 2:
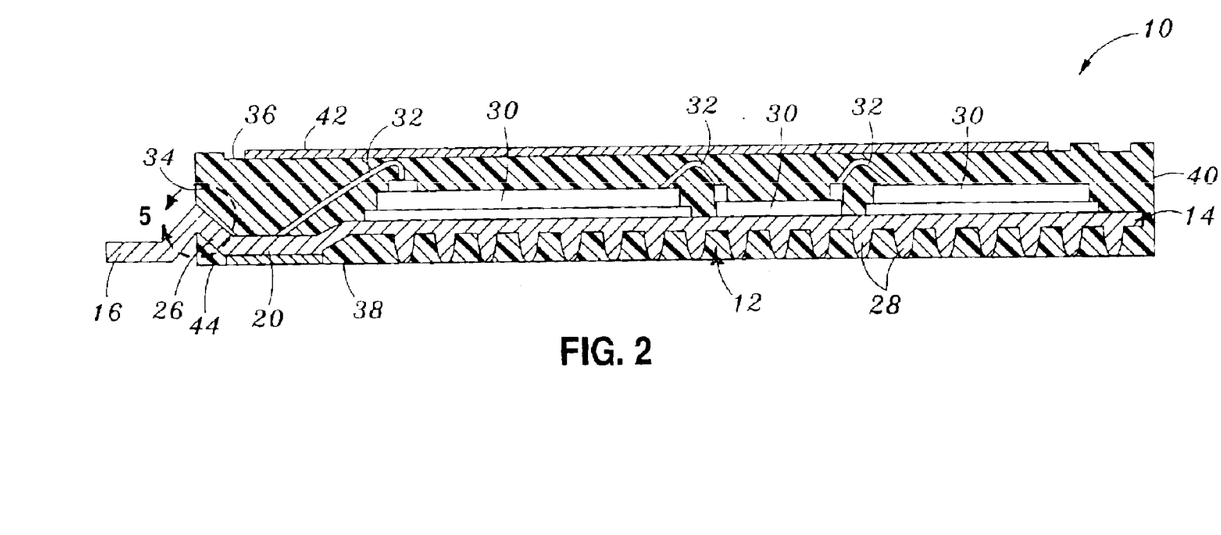
FIG. 2 is a cross-sectional view of the memory card of the first embodiment.

Referring now to the drawings wherein the showings are for purposes of illustrating preferred embodiments of the present invention only, and not for purposes of limiting the same, FIGS. 1 and 2 depict a memory card 10 constructed in accordance with a first embodiment of the present invention. The memory card 10 includes a circuit module 12. The circuit module 12 itself includes a leadframe 14 which is shown in a preliminary, unbent state in FIG. 3 and in its final, bent state in FIG. 2. The particular structural attributes of the leadframe 14 will be described below. As shown in FIGS. 1 and 2, the memory card 10 including the circuit module 12 has a form factor particularly suited for use in a multi-media card memory application. However, those of ordinary skill in the art will recognize that the circuit module 12 of the present invention may also be used in alternative memory card formats including secure digital cards (SDC), compact flash (CF), memory stick, and other small form factor memory cards. The circuit module 12 may further be used in peripheral device cards such as I-O cards.

Figure 3:
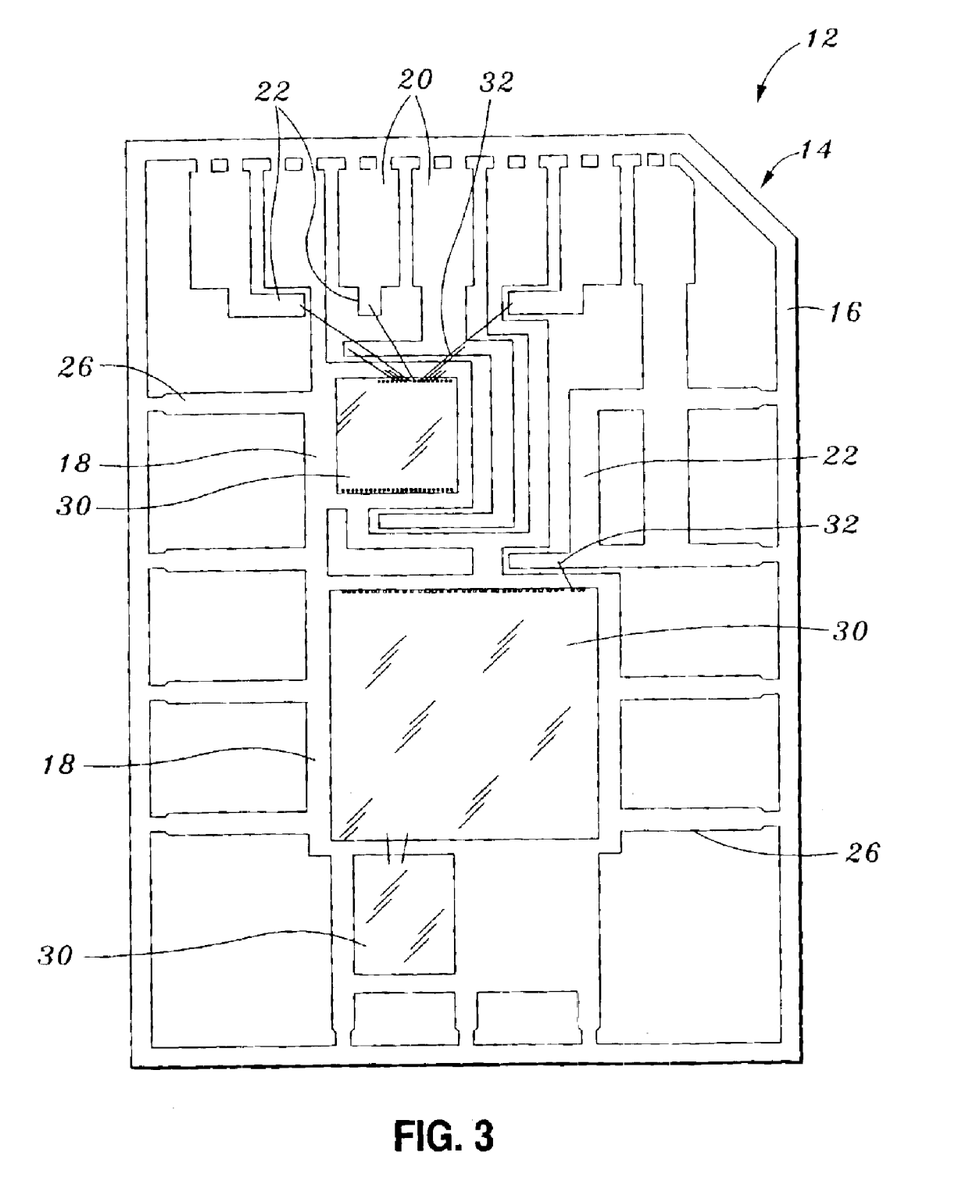
FIG. 3 is a top plan view of a leadframe included in the memory card of the first embodiment in a preliminary, unbent state.

In its preliminary, unbent state, the leadframe 14 of the circuit module 12 comprises an outer frame or dambar 16. The dambar 16 has a generally rectangular configuration defining an opposed pair of longitudinal sides or segments and an opposed pair of lateral sides or segments. The dambar 16 further defines a fifth sloped side which extends angularly between one of the lateral sides and one of the longitudinal sides thereof.

In addition to the dambar 16, the leadframe 14 includes a pair of die attach areas or die pads 18 which are disposed within the interior of the dambar 16. The die pads 18 each define opposed, generally planar top and bottom surfaces. Integrally connected to and extending from one lateral side of the dambar 16 is a plurality of contacts 20 of the leadframe 14. Each of the contacts 20 also defines opposed, generally planar top and bottom surfaces. Integrally connected to and extending from each of the contacts 20 is a conductive trace 22. The traces 22 terminate in close proximity to respective ones of the die pads 18. Tie bars 26 are used to integrally connect the die pads 18 to one or more of the longitudinal and lateral sides of the dambar 16.

In addition to the above-described elements, the leadframe 14 also includes a plurality of stand-offs 28 which are disposed on the bottom surfaces of the die pads 18, traces 22, and tie bars 26 thereof, as seen in FIG. 2. The stand-offs 28 may be included on the leadframe 14 in any one of a wide range of numbers, distributions or patterns. For example, the stand-offs 28 may be included on one or more of the die pads 18, traces 22 and tie bars 16 in any combination and in differing numbers and/or patterns. However, it is contemplated that the number of stand-offs 28 included on the leadframe 14 will be maximized so as to assist in preventing warpage or deflection of the leadframe 14 during a subsequent molding operation associated with the fabrication of the memory card 10 as will be described in more detail below.

As further seen in FIG. 2, each of the stand-offs 28 preferably has an arcuate, generally elliptical configuration defining a rounded distal end. However, those of ordinary skill in the art will recognize that alternative configurations for the stand-offs 28 are contemplated to be within the spirit and scope of the present invention. For example, the stand-offs 28 may each have a conical, triangular, or quadrangular configuration. The leadframe 14 is preferably fabricated from a conductive metal material (e.g., copper) through either a chemical etching or mechanical stamping process. The mechanical stamping process is a preferred method for forming the leadframe 14, the stand-offs 28 being integral with the remainder of the leadframe 14 and formed as a result of the stamping process. However, it is contemplated that the leadframe 14 may be fabricated by initially forming the dambar 16, die pads 18, contacts 20, traces 22 and tie bars 26 from a stamped or etched sheet of metal material, with the stand-offs 28 thereafter being applied to such stamped or etched metal sheet. As shown in FIG. 2, each stand-off 28 has a solid cross-sectional configuration. These solid stand-offs 28 are preferably formed on the leadframe 14 as a result of the completion of a chemical etching process, or through separate application to a stamped or etched metal sheet as described above. When the leadframe 14 is formed through the preferred mechanical stamping process, each stand-off 28 is "dimpled" and thus has a hollow interior, as opposed to having a solid cross-sectional configuration.

In addition to the leadframe 14, the circuit module 12 comprises multiple semiconductor dies 30 which are attached to the top surfaces of the die pads 18. In FIG. 3, one semiconductor die 30 is shown as being attached to the top surface of the die pad 18 disposed closest to the contacts 20, with a pair of semiconductor dies 30 being shown as attached to the top surface of the die pad 18 disposed furthest from the contacts 20. The attachment of the semiconductor dies 30 to the die pads 18 is preferably facilitated through the use of an epoxy or adhesive. Subsequent to such attachment, the contacts or terminals disposed on the top surface of each semiconductor die 30 are electrically connected to one or more traces 22, one or more die pads 18, and/or each other through the use of conductive wires 32. In this regard, the conductive wires 32 effectively place the terminals of the semiconductor dies 30 into electrical communication with the leadframe 14 and, more particularly, to one or more of the contacts 20 thereof.

Those of ordinary skill in the art will recognize that the leadframe 14 may be formed to include any number of contacts 20 depending on the desired application for the memory card 10. Along these lines, the leadframe 14 may further be alternatively configured to define fewer or greater than two die pads for accommodating fewer or greater numbers of semiconductor dies alone or in combination with other devices such as passive devices. In this regard, the three semiconductor dies 30 shown in FIG. 3 may be substituted with one or more semiconductor dies alone or in combination with one or more other devices. Further, one or more semiconductor dies and/or one or more other devices can be attached to a single die pad. The pattern of the conductive traces 22 may also be varied depending upon the number and arrangement of die pads and the number of semiconductor dies and/or other passive devices included in the memory card 10. Thus, the configuration of the leadframe 14 as shown in FIG. 3 is exemplary only, in that the number and arrangement of die pads, contacts, and conductive traces may be varied as needed to satisfy the requirements of a particular application.

Subsequent to the electrical connection of the semiconductor dies 30 to the leadframe 14 in the above-described manner, the leadframe 14 is subjected to a bending operation wherein each of the traces 22 is bent so as to facilitate the creation of an angled or sloped portion therein which is located between the contacts 20 and die pads 18 as shown in FIG. 2. The bending of the traces 20 removes the contacts 20 from their original co-planar relationship to the die pads 18. Thus, the contacts 20 and die pads 18 extend along spaced, generally parallel planes as further shown in FIG. 2. The bending of the leadframe 14 in the above-described manner may occur either prior to the attachment of the semiconductor dies 30 to the top surfaces of the die pads 18, or subsequent to the extension of the conductive wires 32 between the terminals of the semiconductor dies 30 and the traces 22. As is further seen in FIG. 2, the stand-offs 28 are oriented on the leadframe so as to be unaffected by the bending of the leadframe 14 in the above-described manner. In this regard, the angled or sloped portion of each trace 22 is located between the contacts 20 and the stand-offs 28.

Subsequent to the bending of the leadframe 14, an encapsulant material is applied to the leadframe 14, the semiconductor dies 30, and conductive wires 32. The encapsulant material is preferably a plastic (e.g., thermoset, thermoplastic) which, upon hardening, forms a body 34 of the circuit module 12. The body 34 defines a generally planar top surface 36, an opposed, generally planar bottom surface 38, and side surfaces 40 which extend generally perpendicularly between the top and bottom surfaces 36, 38. In the completed body 34, the bottom surfaces of the contacts 20 of the leadframe 14 are exposed within and generally flush with the bottom surface 38 of the body 34. Subsequent to the formation of the body 34, the leadframe 14 is cut or singulated in a manner facilitating the removal of the dambar 16 as is needed to electrically isolate the traces 22 and hence the contacts 20 from each other. In this regard, the body 34 is preferably formed on the leadframe 14 such that the dambar 16 remains exposed (i.e., is not covered by the body 34). The exposure of the dambar 16 allows for the removal of the same from the completely formed body 34. Importantly, the body 34 is formed to provide the prescribed form factor for the memory card 10. In the completed memory card 10, a label 42 is typically applied to the top surface 36 of the body 34.

As seen in FIG. 2, the stand-offs 28 of the leadframe 14 are oriented so as to extend toward the bottom surface 38 of the body 34 in the completed memory card 10. It is contemplated that in the configuration of the memory card 10 shown in FIG. 2 (referred to as a reversed down-set configuration), the stand-offs 28 and, in particular, the rounded distal ends thereof, will not be visible within the bottom surface 38 of the body 34, but rather will be completely covered by the body 34. During the molding process used to form the body 34, the stand-offs 28 included in the leadframe 14 assist in preventing the die pads 18, traces 22 and tie bars 26 of the leadframe 14 from being warped, bent or otherwise pushed down during the molding operation as could result in portions thereof being undesirably exposed in the body 34. The stand-offs 28 may also optionally be used as test point access for the memory card 10.

Figure 4:
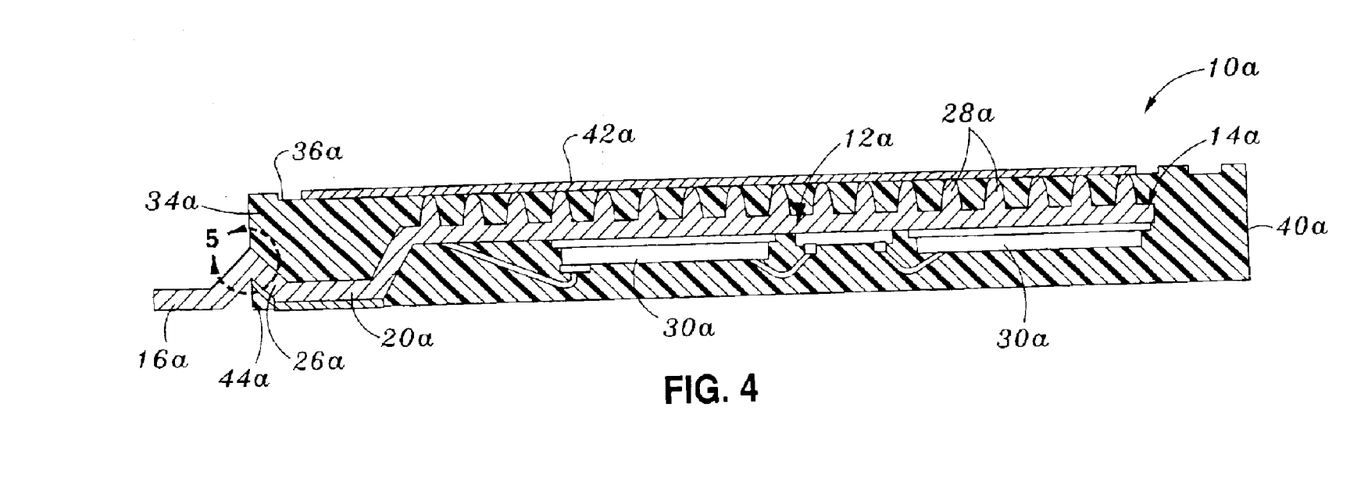
FIG. 4 is a cross-sectional view of a memory card which is constructed in accordance with a second embodiment of the present invention and has a multi-media card form factor.

Referring now to FIG. 4, there is shown a memory card 10*a* constructed in accordance with a second embodiment of the present invention. The memory card 10*a* is substantially similar in structure to the above-described memory card 10, except that the circuit module 12*a* thereof is formed such that the semiconductor dies 30*a* are attached to the bottom surfaces of the die pads of the leadframe 14*a*, as opposed to the top surfaces thereof as in the circuit module 12. As a result, the stand-offs 28*a* of the leadframe 14 are included on the top surfaces of the die pads and/or traces and/or tie bars of the leadframe 14*a*, rather than on the bottom surfaces thereof as in the leadframe 14. The configuration of the memory card 10*a* shown in FIG. 4 is commonly referred to as a deep down-set configuration. Another variation between the leadframes 14, 14*a* is that the sloped portion of each trace within the leadframe 14*a* is longer and steeper than that of each trace 22 of the leadframe 14, as is necessitated by the attachment of the semiconductor dies 30*a* to the bottom surfaces of the die pads of the leadframe 14*a*. It is contemplated that in the memory card 10*a*, the rounded distal ends of the stand-off's 28*a* will be exposed in the top surface 36*a* of the body 34*a* of the memory card 10*a*. However, the exposed distal ends of the stand-offs 28*a* will be covered by the label 42*a* normally applied to the top surface 36*a*. The functionality of the stand-offs 28*a* of the memory card 10*a* is the same as the stand-offs 28 of the memory card 10. Additionally, the stand-offs 28*a* may each be formed with a hollow, dimpled configuration (as a result of the completion of a mechanical stamping process to form the leadframe 14*a*) as described above in relation to the stand-offs 28, rather than having the solid cross-sectional configuration as shown in FIG. 4.

Figure 5:
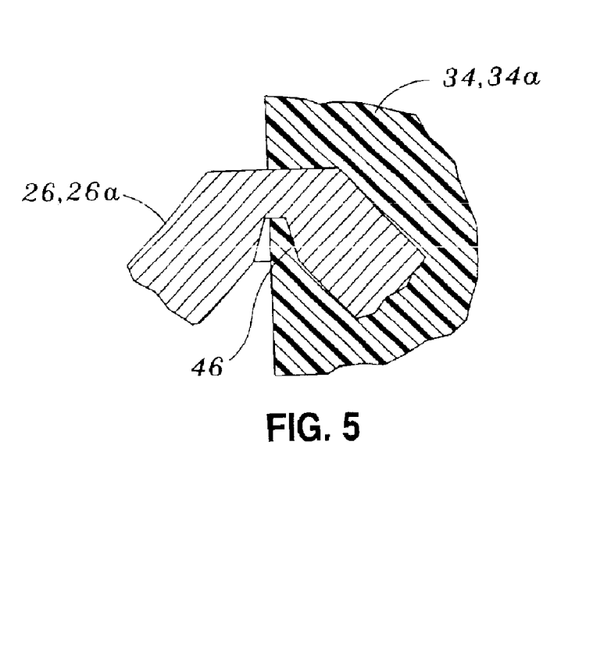
FIG. 5 is an enlargement of the encircled region 5 shown in FIGS. 2 and 4, illustrating a leadframe singulation enhancement feature of the memory card leadframe.
Figure 6:
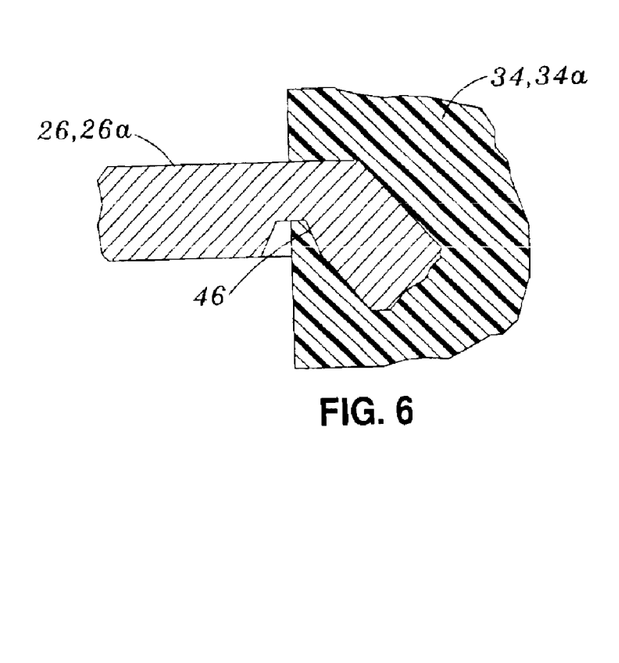
FIG. 6 is a partial cross-sectional view similar to FIG. 5, illustrating an alternative leadframe singulation enhancement feature of the memory card leadframe.

In FIGS. 2 and 4, the memory card 10, 10*a* is depicted prior to the singulation of the dambar 16, 16*a* from the remainder of the leadframe 14, 14*a*. In addition to the traces of the leadframe 14, 14*a* being bent to form the above-described angled or sloped portions therein, those tie bars 26, 26*a* of the leadframe 14, 14*a* which extend between the contacts 20, 20*a* and dambar 16, 16*a* are also bent or angled in a manner which results in the fully formed body 34, 34*a* including a segment 44, 44*a* which extends between the exposed bottom surfaces of the contacts 20, 20*a* and that side surface 40, 40*a* of the body 34, 34*a* disposed adjacent thereto. As seen in FIG. 5, to assist in the eventual singulation of the dambar 16, 16*a* from the leadframe 14, 14*a*, these angled portions of the tie bar 26, 26*a* may each optionally include a notch 46 therein. The notch 46 is filled with the material used to form the body 34, 34*a*, and causes the tie bar 26, 26*a* to define an area of reduced thickness which simplifies the singulation or severing thereof. As shown in FIG. 5, the bent portion of each tie bar 26, 26*a* has a generally V-shaped configuration, with the notch 46 being located in the apex thereof. FIG. 6 depicts an alternative configuration for the angled portions of the tie bars 26, 26*a*. In this alternative configuration, the notch 46 is still formed so as to be located in a position wherein the same is bisected by that side surface 40, 40*a* of the body 34, 34*a* disposed closest to the contacts 20, 20*a*, as is also the orientation of the notch 46 shown in FIG. 5.

Those of ordinary skill in the art will recognize that insert molding using plastic molding processing techniques to facilitate the encapsulation of the circuit module 12, 12*a* or other memory module may be used to produce a media card in any form factor, not necessarily limited to the form factor of the memory card 10, 10*a* shown in FIGS. 2 and 4. In the case of insert molding a media card, a module (e.g., the circuit module 12, 12*a*) is first placed into a mold cavity shaped for a certain form factor. The mold is then closed onto the module, with a polymeric material then being injected around the module. The polymeric matrix resin could be a thermoplastic, rubber, thermoset or any combination of these materials. Possible form factors include memory and I/O cards, including multi-media cards, secure digital cards, thin secure digital cards, compact flash cards, and other small form factor media cards. The plastic processing techniques that could be employed in relation to the formation of the body 34, 34*a* include injection molding, resin transfer molding, infusion molding, reaction injection molding, and each of their variations. These processes can be used in conjunction with the insertion of a module into a mold to facilitate the manufacture of media cards with the least amount of downstream automated handling. The end product of the process involved in the encapsulation of the module inserted into the mold is a plastic surrounded electronics module having a certain form factor.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A circuit module comprising:
    a leadframe having:
        at least one die pad defining opposed, generally planar top and bottom surfaces;
        a plurality of contacts, each of the contacts defining opposed, generally planar top and bottom surfaces;
        a plurality of conductive traces extending from respective ones of the contacts toward the die pad, each of the traces defining opposed, generally planar top and bottom surfaces, the die pad and the contacts extending along respective ones of spaced, generally parallel frame planes; and
        a plurality of stand-offs disposed on and extending from at least one of the die pad and the traces;
    at least one semiconductor die attached to the bottom surface of the die pad such that the semiconductor die extends along a die plane which is disposed between and generally parallel to the frame planes, the semiconductor die being electrically connected to at least one of the traces; and
    a body at least partially encapsulating the leadframe and the semiconductor die such that the bottom surfaces of the contacts are exposed in and substantially flush with a bottom surface defined by the body.

2. The circuit module of claim 1 wherein a plurality of conductive wires is used to electrically connect the semiconductor die to the traces.

3. The circuit module of claim 1 wherein the stand-offs are disposed on the top surfaces of the die pad and the traces.

4. The circuit module of claim 1 wherein each of the traces defines a sloped portion extending between the die pad and the contacts.

5. The circuit module of claim 1 wherein each of the stand-offs defines a rounded distal end.

6. A circuit module comprising:
    a leadframe having:
        at least one die pad;
        a plurality of contacts;
        a plurality of conductive traces extending from respective ones of the contacts toward the die pad; and
        a plurality of stand-offs disposed on at least one of the die pad and the traces, each of the stand-offs defining a rounded distal end;
    at least one a semiconductor die attached to the die pad and electrically connected to at least one of the traces; and
    a body at least partially encapsulating the leadframe and the semiconductor die such that the contacts are exposed in a bottom surface defined by the body.

7. The circuit module of claim 6 wherein a plurality of conductive wires is used to electrically connect the semiconductor die to the traces.

8. The circuit module of claim 6 wherein:
    the die pad defines opposed, generally planar top and bottom surfaces;
    each of the contacts defines opposed, generally planar top and bottom surfaces;
    each of the traces defines opposed, generally planar top and bottom surfaces;
    the semiconductor die is attached to the top surface of the die pad; and
    the bottom surfaces of the contacts are exposed in and substantially flush with the bottom surface of the body.

9. The circuit module of claim 8 wherein the stand-offs are disposed on the bottom surfaces of the die pad and the traces.

10. The circuit module of claim 6 wherein each of the traces defines a sloped portion extending between the die pad and the contacts.

11. A memory card comprising:
    a leadframe having:
        at least one die pad defining opposed, generally planar top and bottom surfaces;
        a plurality of contacts, each of the contacts defining opposed, generally planar top and bottom surfaces;
        a plurality of conductive traces extending from respective ones of the contacts toward the die pad, each of the traces defining opposed, generally planar top and bottom surfaces, the die pad and the contacts extending along respective ones of spaced, generally parallel frame planes; and
        a plurality of stand-offs disposed on and extending from at least one of the die pad and the traces;
    at least one semiconductor die attached to the bottom surface of the die pad so as to extend along a die plane which is disposed between and generally parallel to the frame planes, the semiconductor die being electrically connected to at least one of the traces; and
    a body at least partially encapsulating the leadframe and the semiconductor die such that the bottom surfaces of the contacts are exposed in and substantially flush with a bottom surface defined by the body.

12. The memory card of claim 11 wherein a plurality of conductive wires is used to electrically connect the semiconductor die to the traces.

13. The memory card of claim 11 wherein the stand-offs are disposed on the top surfaces of the die pad and the traces.

14. The memory card of claim 11 wherein each of the traces defines a sloped portion extending between the die pad and the contacts.

15. The memory card of claim 11 wherein each of the stand-offs defines a rounded distal end.

16. A circuit module comprising:
    a leadframe having:
        at least one die pad;
        a plurality of contacts;
        a plurality of conductive traces extending from respective ones of the contacts toward the die pad, each of the traces defining a sloped portion between the die pad and the contacts such that the die pad and the contacts extend along respective ones of spaced, generally parallel frame planes; and
        a plurality of stand-offs disposed on and extending from at least one of the die pad and the traces;
    at least one semiconductor die attached to the die pad and electrically connected to at least one of the traces; and
    a body at least partially encapsulating the leadframe and the semiconductor die such that the contacts are exposed in a bottom surface defined by the body.

17. The circuit module of claim 16 wherein the semiconductor die is attached to the die pad such that the semiconductor die extends along a die plane which is disposed between and generally parallel to the frame planes.

18. A memory card comprising:
    a leadframe having:
        at least one die pad;

a plurality of contacts;

a plurality of conductive traces extending from respective ones of the contacts toward the die pad; and a plurality of stand-offs disposed on at least one of the die pad and the traces, each of the stand-offs defining a rounded distal end;

at least one a semiconductor die attached to the die pad and electrically connected to at least one of the traces; and a body at least partially encapsulating the leadframe and the semiconductor die such that the contacts are exposed in a bottom surface defined by the body.

19. A memory card comprising:

a leadframe having:

at least one die pad;

a plurality of contacts;

a plurality of conductive traces extending from respective ones of the contacts toward the die pad, each of the traces defining a sloped portion between the die pad and the contacts such that the die pad and the contacts extend along respective ones of spaced, generally parallel frame planes; and a plurality of stand-offs disposed on and extending from at least one of the die pad and the traces;

at least one semiconductor die attached to the die pad and electrically connected to at least one of the traces; and a body at least partially encapsulating the leadframe and the semiconductor die such that the contacts are exposed in a bottom surface defined by the body.

20. The memory card of claim 19 wherein the semiconductor die is attached to the die pad such that the semiconductor die extends along a die plane which is disposed between and generally parallel to the frame planes.

* * * * *